United States Patent [19]

Whitley

[11] Patent Number: 4,561,166
[45] Date of Patent: Dec. 31, 1985

[54] COMPONENT LEAD PROCESSING APPARATUS

[75] Inventor: George J. Whitley, Philadelphia, Pa.

[73] Assignee: RCA Corporation, Princeton, N.J.

[21] Appl. No.: 589,330

[22] Filed: Mar. 14, 1984

[51] Int. Cl.⁴ ............... B23Q 41/00; H05K 13/04
[52] U.S. Cl. ................................. 29/566.3; 29/741
[58] Field of Search .......... 29/33 M, 566.3, 566.4, 29/739, 741, 742, 564.1, 759, 705

[56] References Cited

U.S. PATENT DOCUMENTS

| | | |
|---|---|---|
| 667,350 | 2/1901 | Ulrich et al. |
| 2,748,613 | 6/1956 | Guay .................................. 74/104 |
| 3,907,008 | 9/1975 | Bates et al. ..................... 29/741 X |
| 4,005,614 | 2/1977 | Moore et al. ..................... 74/501 |
| 4,054,988 | 10/1977 | Masuzima et al. ............ 29/564.6 |
| 4,153,082 | 5/1979 | Foley ................................. 148/105 |
| 4,215,469 | 8/1980 | Asai et al. .......................... 29/835 |
| 4,377,026 | 3/1983 | Whitley .......................... 29/564.1 |
| 4,464,829 | 8/1984 | Whitley et al. ................ 29/739 X |

Primary Examiner—Eugene F. Desmond
Attorney, Agent, or Firm—J. S. Tripoli; Joseph S. Tripoli; George E. Haas

[57] ABSTRACT

A lead processing assembly includes a pair of aligned lead cutting and bending discs having adjacent lead processing edges which rotate tangentially to process closely-spaced leads of a component. The discs are driven concurrently by corresponding nested levers operated by a camming slot displaced linearly to rotate the discs in two angular directions. A plurality of such assemblies can be driven by a common cam drive plate.

11 Claims, 6 Drawing Figures

COMPONENT LEAD PROCESSING APPARATUS

The present invention relates to component lead processing apparatuses, and more particularly, to apparatuses which cut and bend component leads to secure a component to a printed circuit board.

Of interest are the following copending U.S. patent applications: Ser. No. 558,367, filed Dec. 5, 1983, entitled "Component Lead Processing Apparatus," by Wojciech Starski; Ser. No. 531,242, filed Sept. 12, 1983, entitled "Component Lead Processing Device," by Wojciech Starski; Ser. No. 363,960, filed Mar. 31, 1982, entitled "Multiple Component Lead Processing Apparatus," by George J. Whitley et al., now U.S. Pat. No. 4,520,549, June 4, 1985; Ser. No. 302,294, filed Sept. 14, 1981, entitled "Component Lead Processing Device," by George J. Whitley et al., now U.S. Pat. No. 4,513,493, April 30, 1985; Ser. No. 455,992, filed Jan. 6, 1983, entitled "Apparatus for Securing a Component to a Printed Circuit Board," by George J. Whitley now U.S. Pat. No. 4,462,435, July 31, 1984; Ser. No. 469,722, filed Feb. 25, 1983, entitled "Bending Device," by Frederick W. Kopitzke, III et al., abandoned; Ser. No. 469,737, filed Feb. 25, 1983, entitled "Component Lead Bending Apparatus," by George J. Whitley et al., now U.S. Pat. No. 4,464,829, Aug. 14, 1984; and Ser. No. 484,258, filed April 12, 1983, entitled "Apparatus for Detecting the Presence of Components on a Printed Circuit Board," by George J. Whitley, now U.S. Pat. No. 4,463,310, July 31, 1984. All of the above applications and patents are assigned to the assignee of the present invention.

As known, a printed circuit board includes numerous closely-spaced lead receiving apertures. Components may be automatically or manually assembled to the circuit board (which may be on a conveyor) by inserting component leads through the corresponding circuit board apertures. Later in the process it is required that the undersurface of the board pass over a wave soldering machine or the like which solders the protruding component leads to printed circuit board conductors. However, there is an interval between the time that component leads are inserted into the circuit board apertures and the time the circuit board passes through the soldering apparatus. During this time interval it is possible for the components to disengage from the circuit board.

Therefore, to prevent the components from becoming disengaged from the circuit board, it is desired that the protruding leads be crimped or bent over against the circuit board undersurface to preclude the leads from falling out of their corresponding apertures. At times the leads may also be undesirably long and need to be cut or trimmed prior to being bent. Copending U.S. patent application Ser. No. 469,737, filed Feb. 25, 1983, mentioned above, discloses an apparatus for bending such protruding leads. Other apparatus are employed for lead trimming and bending. Lead trimming and bending apparatuses are disclosed in several of the above-mentioned copending applications and in U.S. Pat. Nos. 2,827,634; 3,167,779; 3,414,024; 3,574,934; 3,732,898; 4,051,593; 4,054,988; 4,153,082; 4,165,557; and 4,377,026, among others.

One problem encountered in the described manufacturing process arises with microminiature components. For example, some transistors and other electrical components tend to have their leads spaced apart approximately 0.100 inch. This is a relatively small spacing and many of the disclosed apparatus in the copending applications and U.S. patents mentioned above are not especially suitable for processing such closely-spaced leads. In some cases, it is required to artificially widen the spacing between component leads to accommodate conventional lead processing apparatuses. Aforementioned copending U.S. patent application, Ser. No. 531,242, filed Sept. 12, 1983, deals with the problem of printed circuit boards crowded with closely spaced components. However, that application discloses two pistons, each corresponding to a separate component lead. This structure is relatively bulky, taking up a relatively large amount of space.

In copending application Ser. No. 302,294, filed Sept. 14, 1981, mentioned above, there is disclosed in FIG. 7 an array of three devices with the cut-and-clinch heads contiguous with each other in angular segments. As disclosed, it is possible to place the devices in closely-spaced arrays in many different locations on a conveyor for processing closely-spaced component leads. However, each disclosed lead processing device has a corresponding air cylinder 14 and actuating mechanism. A lead processing head and cut-and-clinch member is associated with each air cylinder. The use of a separate air cylinder for each lead processing head is relatively bulky and also occupies considerable space.

In aforementioned copending application Ser. No. 363,960, filed March 31, 1982, a multiple component lead processing apparatus is disclosed. A separate head may be employed for processing the leads of a single component, as illustrated in FIG. 4. However, the disclosed lead cutting and bending heads are not individually designed for processing closely spaced leads, for example, leads on 0.100 inch centers. That is, a single cutting and bending head requires a minimum relatively large lead spacing due to the presence of the central shaft between the different spaced cutting and bending portions of a given processing head. Multiple component lead processing assemblies of the type disclosed may be employed in closely-spaced arrays, but these multiple lead processing arrays also may take up more space than desired.

A relatively compact component lead processing apparatus according to one embodiment of the present invention comprises support means for supporting and aligning a printed circuit board relative thereto. Lead processing means are coupled and aligned relative to the support means for processing a pair of leads of a component borne by the printed circuit board. The lead processing means comprises a stationary first member secured to the support means and second and third rotatable members. The second member is rotatable relative to the first member about a first axis. The third member is rotatable relative to the first member about a second axis parallel to and spaced from the first axis. The first member has an aperture for receiving the pair of leads to be processed in the direction parallel to the axes. The second and third members each include lead processing means adapted to cooperate with the first member for processing respective different ones of the pair of leads in response to rotation of the second and third members. Drive means are coupled to the support means for concurrently rotating the second and third members about their respective first and second axes. By employing two rotatable members which cooperate with a stationary first member, a relatively compact apparatus can process closely-spaced component leads, the apparatus occupying a minimum amount of space to thereby permit more such components to be processed concurrently than otherwise possible.

Figure 1:
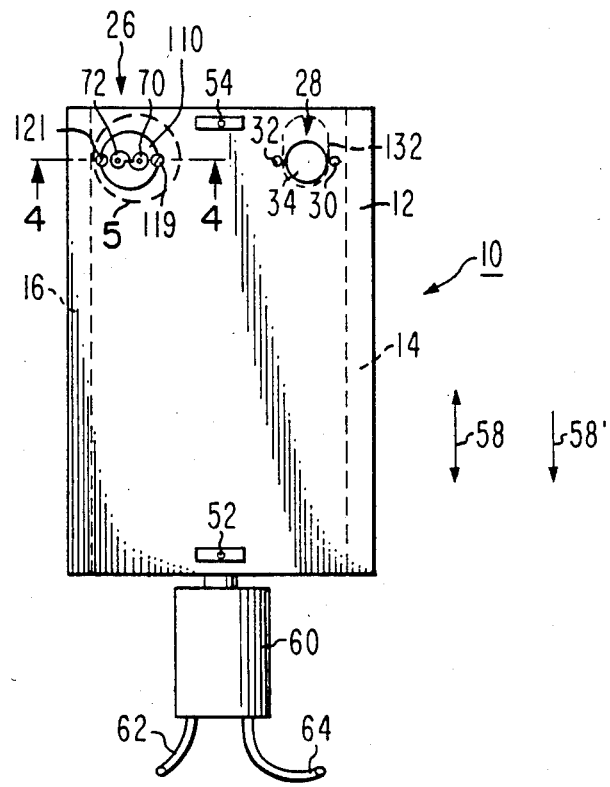
FIGS. 1 and 2 are plan and elevation views, respectively, of a printed circuit board component lead processing apparatus in accordance with one embodiment of the present invention.
Figure 2:
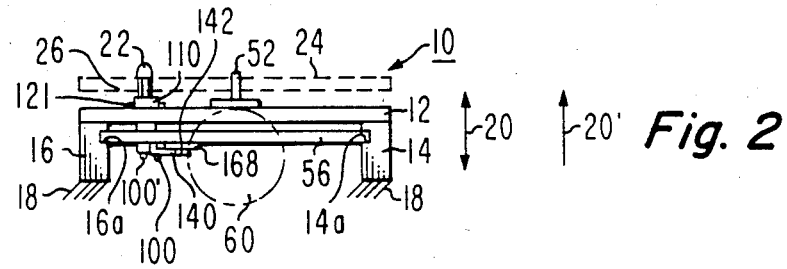

In FIGS. 1 and 2, component lead processing apparatus 10 includes a support structure comprising a plate 12 and two frame and guide members 14 and 16 to which plate 12 is secured. The frame members 14 and 16 are secured to supporting structural members (not shown) represented by symbols 18, such as a conveyor belt support in a factory assembly line.

By way of example, the supporting structure may be as disclosed in U.S. Pat. No. 4,377,026. In such a structure, the rails 14 and 16 are coupled to pistons which move the plate 12 and rails 14, 16 in directions 20, FIG. 2. The plate 12 is moved in directions 20 to cause the tools attached thereto, as will be discussed below, to be placed in a position to engage components such as component 22 on printed circuit board 24, FIG. 2, shown in phantom. The printed circuit board 24 is supported on a conveyor (not shown), as disclosed in that patent. The conveyor conveys printed circuit board 24 to a juxtaposed aligned position with the apparatus 10. At least one, but typically a plurality of component lead processing assemblies 26, to be described in more detail below, are secured to plate 12. One such processing assembly is illustrated in FIGS. 1 and 2.

Apertures 30, 32, and 34 are in the plate region 28, FIG. 1, for accepting a second lead processing assembly. Apertures 30 and 32 are threaded to accept screws, for example, screws 119 and 121, respectively, to secure a processing assembly in place. Aperture 34 receives a portion of a lead processing assembly, such as assembly 26. Apertures similar to apertures 30, 32, and 34 are located in plate 12 for each lead processing assembly 26 to be secured to plate 12. The processing assemblies 26 are positioned on plate 12 at locations and in orientations determined by the location and orientation on a printed circuit board 24 of the components whose leads are to be processed. The component 22, shown in phantom, may be a capacitor, but may also be a transistor, resistor, and so forth.

Figure 4:
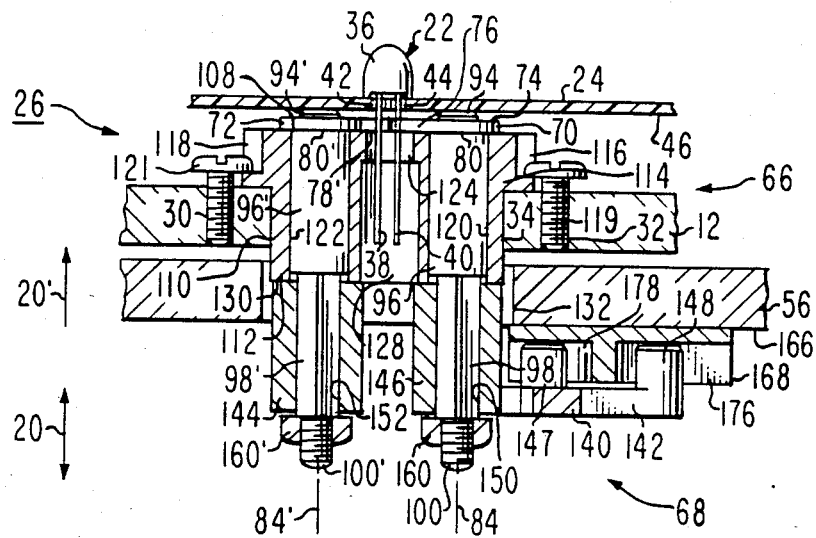
FIG. 4 is a sectional view taken along lines 4—4 of FIG. 1 illustrating one embodiment of a component lead processing assembly for cutting and bending the leads of an electrical component mounted on a printed circuit board.

In FIG. 4, component 22 (or other electrical component to be secured to the printed circuit board 24) comprises a body 36 and two leads 38, 40 protruding from the body 36 and passing through respective apertures 42 and 44 in printed circuit board 24. Certain portions of the leads 38 and 40 protruding below the undersurface 46 of printed circuit board 24 are to be cut, for example, the portions extending below surfaces 80, 80', and the remaining portions are to be bent against the board surface 46. The bending secures the component 22 to the printed circuit board prior to the application of solder which mechanically and electrically connects the leads to corresponding conductors (not shown) on printed circuit board undersurface 46. By way of example in FIG. 6, lead 38' is shown bent over abutting a printed circuit board conductor 48 and lead 40' is shown bent over and abutting printed circuit board conductor 50 after processing by the assembly 26, FIGS. 1, 2, and 4.

Printed circuit board 24 (FIG. 2) is positioned relative to plate 12 by locating pins 52, 54 (FIG. 1) secured to plate 12. Printed circuit board 24 has matching locating apertures which mate with pins 52, 54 to align the board and the component 22 with the lead processing assembly 26. As disclosed in the aforementioned U.S. Pat. No. 4,377,026, the printed circuit board 24 is moved in juxtaposed alignment with the pins 52, 54 on plate 12 and then the processing apparatus 10 is moved toward the printed circuit board, direction 20' causing the pins 52, 54 to engage the locating apertures in the board 24. This engaged relative orientation is illustrated in FIG. 2.

Moveable plate 56, FIG. 2, slides in members 14 and 16, guide slots 14a and 16a, respectively, in directions 58, FIG. 1, parallel to and spaced from plate 12. In FIG. 1, air cylinder 60, which is mechanically secured to the structure to which members 14 and 16 are secured, moves plate 56 in directions 58. Air cylinder 60 is operated in one or the other direction of directions 58 in response to pressurized air supplied in corresponding one or the other of hoses 62, 64. The purpose of plate 56 in moving in directions 58 is to impart simultaneous rotary motion to the lead processing parts of the assembly 26, as will be described.

Figure 3:
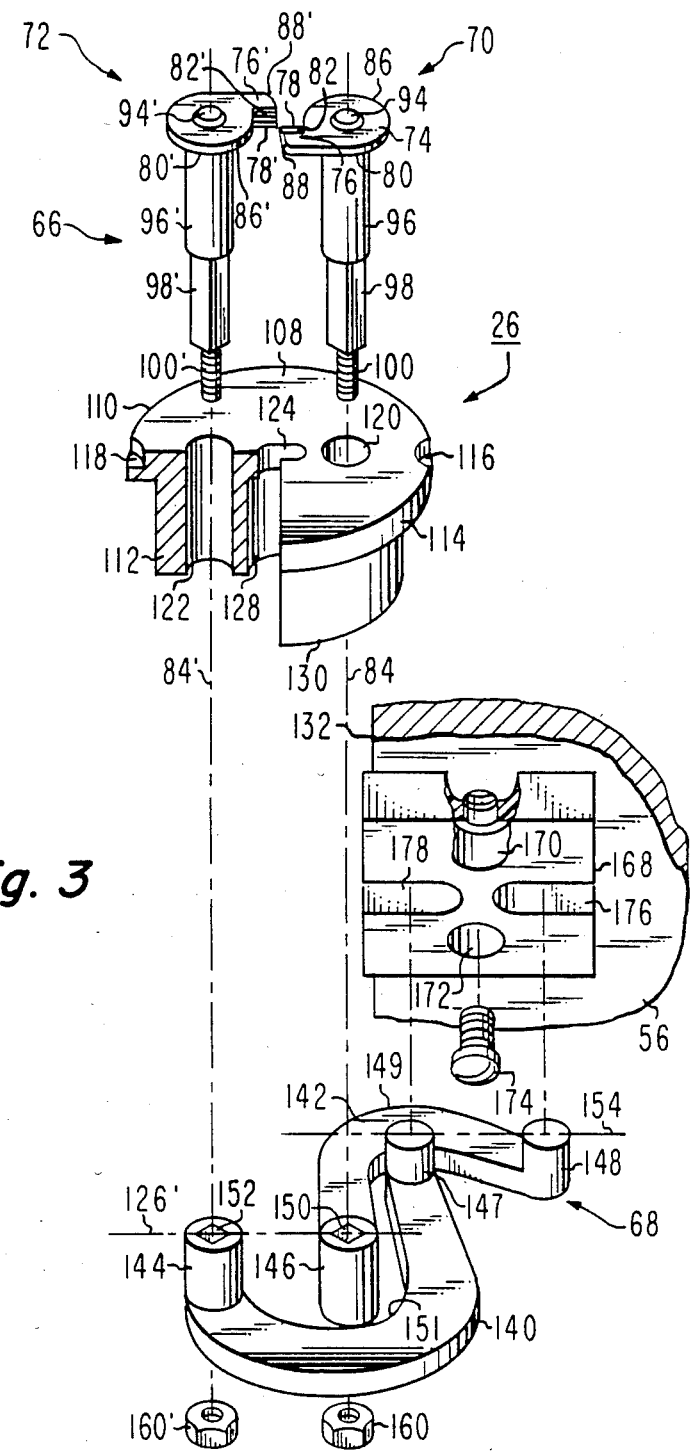
FIG. 3 is an isometric exploded view of a portion of the apparatus of FIG. 1.
Figure 5:
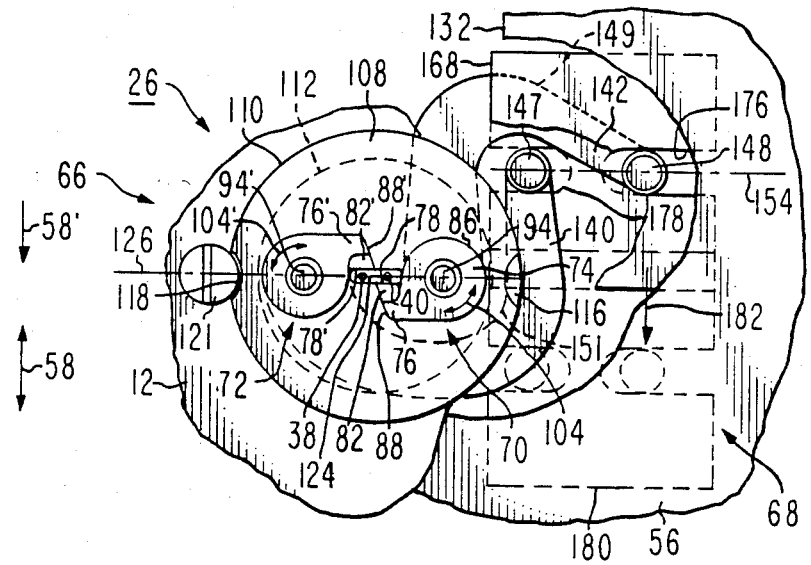
FIG. 5 is a more detailed plan view of area 5 in circled dashed line FIG. 1, partially fragmented, illustrating elements of the lead processing apparatus employed in the apparatus of FIG. 1.

In FIGS. 3, 4, and 5, the lead processing assembly 26 comprises a lead cutting and bending assembly 66 and a drive assembly 68. The lead cutting and bending assembly 66 comprises a pair of rotatable cutting and bending heads 70, 72 which are identical. The description that follows of the cutting and bending head 70, therefore, is representative of the construction of the bending head 72. Several of the like elements on heads 70, 72 are primed on head 72. The heads 70, 72 are coplanar in the assembly.

The bending head 70 comprises a disc 74 of general circular periphery and relatively thin thickness having an extended leg 76. The leg 76 has a cutting edge 78 which is formed by the plane lower surface 80 of the disc 74 and the tapered lead bending surface 82. The edge 78 is offset from and parallel to a radial line passing through central axis 84 about which head 70 rotates. Cutting edge 78 extends radially between disc 74 peripheral surfaces 86, 88.

A small frusto-conical projection 94 extends above the upper planar surface of the disc 74. A circular cylindrical bearing shaft 96 depends from disc 74. The bearing shaft 96 rotates about axis 84. A drive leg 98, square in transverse section, depends from shaft 96. A threaded stud 100 depends from the drive leg 98.

Head 72 cutting edge 78' is parallel to and spaced from cutting edge 78 of head 70 in the stand-by mode prior to processing a lead. The cutting edge 78' is offset from and parallel to a radial line passing through axis 84' about which head 72 rotates. Cutting edges 78, 78', FIG. 5, rotate about parallel respective axes 84, 84' in close, near tangential spacing in directions 104, 104'.

The heads, due to their close tangential spacing, can engage and process component leads that are spaced 0.100 inch or closer.

In FIGS. 3 and 4, the undersurfaces 80, 80' of the respective heads 70, 72 abut and slide on surface 108 of anvil member 110. Member 110 includes a right circular cylindrical shaft portion 112 and an annular flange 114. The flange 114 has diametrically opposite recesses 116, 118 for receiving the heads of screws 119, 121, FIG. 4. The heads of screws 119, 121, abut against the flange 114 portion in the recesses 116, 118 to secure the flanges and thus the anvil member 110 to the plate 12, FIG. 4. Two parallel circular cylindrical bearing apertures 120 and 122 in the member 110 body are centrally located on respective axes 84, 84'. Apertures 120, 122, respectively, receive and engage bearing shafts 96, 96' which rotate about axes 84, 84'. A central elongated aperture 124 is between bearing apertures 120, 122 in the member 110. The aperture 124 long dimension is centered on a line 126, FIG. 5, passing through axes 84, 84'. Line 126 may be normal to direction 58, FIG. 1, or at any other angular orientation according to the component lead orientation. The cutting edges 78, 78', FIG. 5, are spaced equidistant from line 126. The line 126 passes through the leads 38 and 40 when inserted in aperture 124. A circular cylindrical aperture 128 is in communication with the aperture 124 and with the lower surface 130 of the member 110. The circular cylindrical shaft portion 112 of member 110 is closely received in circular aperture 34 of plate 12, FIG. 4.

In FIG. 4, the plate 56 has a slot 132 (shown in phantom in FIG. 1) which is aligned with aperture 34 of plate 12. The long dimension of slot 132 extends in and out of the drawing FIG. 4. The slot 132 has an extent such that it remains aligned with the aperture 34 in directions 20 as the plate 56 is traversed in directions 58, FIG. 1 (in and out of the drawing FIG. 4), by cylinder 60. That is, slot 132 moves relative to stationary member 110 portion 112 located in slot 132.

In FIGS. 3 and 4, curved, generally C-shaped, drive levers 142, 140 each have a drive head 146, 144, respectively, at one end. The drive heads 146 and 144 have respective square apertures 150, 152 which receive and engage the square drive legs 98, 98' of the respective heads 70, 72. The square apertures 150, 152 pass entirely through the levers, FIG. 4. The other end of lever 140 has a cam follower 147 which may be a circular cylindrical projection and the other end of lever 142 has a cam follower 148 which is similar in construction to the cam follower 147. For example, the levers 140, 142 may be made out of sheet metal and the drive heads 144, 146 and cam followers 147, 148 may be integral therewith. The cam follower 147 is nested adjacent the central bend 149 of lever 142 in the space between drive head 146 and the cam follower 148. The drive head 146 of lever 142 is nested adjacent the bend 151 of lever 140 in the space between drive head 144 and cam follower 147. The threaded studs 100, 100' project from the respective levers 140, 142, FIG. 4. Nuts 160, 160' engage threads 100, 100', respectively, for securing the levers to the corresponding drive heads. Nuts 160, 160' abut legs 98, 98' so that levers 140, 142 are somewhat loosely attached between the nuts and member 110 so the levers may rotate relative to member 110.

The cam followers 147, 148 are centered on a line 154 which may be normal to directions 58, FIG. 1. The drive heads 144, 146 are centered on line 126' which passes through the axes 84, 84' and which is spaced from and parallel to line 126. The lines 154 and 126' are shown parallel but may have other relative orientations. The cam follower 147 being nested by lever 142 and the drive head 146 being nested by lever 140 provides a compact drive mechanism for rotating the heads 70, 72 relative to stationary member 110.

In FIG. 5, a portion of plate 56 is broken away to illustrate the relative positions of levers 140 and 142. The levers 140, 142 are beneath the plate 56, FIG. 4, and ordinarily would be hidden from view.

Camming block 168 is secured to the undersurface 166 of plate 56, FIG. 4. In FIG. 3, the camming block 168 has two like stepped apertures 170 and 172 for receiving screws 174 (one being shown) which secure the block to plate 56. Block 168 includes two camming slots 176 and 178 which are aligned on line 154. Slot 176 receives cam follower 148 and slot 178 receives cam follower 147. Block 168 displaces the cam followers in directions 58, FIG. 1, in response to the linear motions of plate 56. This displacement causes cam followers 147, 148 to slide in the respective slots 176, 178 as they are moved in directions 58. This rotates the levers 140, 142 about the respective axes 84, 84', FIG. 4, rotating the cutting and bending heads 70, 72. Block 168 is closely spaced to axes 84 and 84', FIG. 4, as permitted by the curved nested spaced relationship of the corresponding levers 140, 142 driven by the block 168. This nested relationship permits a relatively compact lead cut-and-bending mechanism which occupies a relatively small amount of space on plates 12 and 56. This permits a number of closely-spaced assemblies for operating on closely-spaced components such as component 22 and others (not shown).

In operation, the protruding ends of leads 38, 40 are passed through aperture 124 into aperture 128 in the aligned, prepositioned member 110, FIG. 4. In FIG. 5, lead 38 is aligned with cutting edge 78 of head 70 and lead 40 is aligned with cutting edge 78' of head 72. At this time, air pressure is supplied air cylinder 60, FIG. 1, via one of hoses 62, 64 to displace plate 56 in direction 58', FIGS. 1 and 5. This displaces the camming block 168 to the position shown in phantom at 180, FIG. 5, moving the cam followers in direction 182. This motion causes the levers to rotate lead processing heads 70, 72 in the same one relative angular direction of directions 104, 104', e.g., clockwise in FIG. 5. The cutting edges are concurrently moved in opposite adjacent tangential directions to thereby cut and subsequently bend the protruding portions of leads 38 and 40 at the plane of the bending heads undersurfaces 80, 80', FIG. 4. The peripheral surfaces 88, 88' of respective lead processing legs 76, 76' move in opposite closely-spaced tangential directions and may abut in sliding engagement during such rotation.

Figure 6:
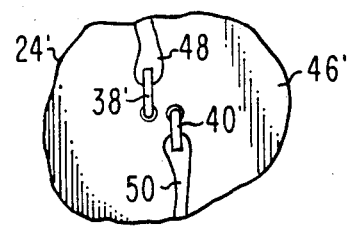
FIG. 6 is a plan underside view of a printed circuit board after the leads of the component have been processed by the apparatus of the present invention.

The tapered surfaces 82, 82' adjacent the cutting edges slide against the remaining protruding abutting end portions of the leads 38, 40 forcing them up against the printed circuit board undersurface 46, to the position of FIG. 6. After this, air pressure is then supplied to the air cylinder 60 in reverse direction to return the levers to the position shown in the drawing figures.

While the action on one lead processing assembly has been illustrated, it is to be understood that a plurality of such lead processing assemblies can be operated on concurrently when such assemblies are attached to plate 12, FIG. 1. The single motion of the plate 56, FIG. 2, concurrently operates all of the processing assemblies in response to that single displacement of plate 56. The cut portions of the leads 38 and 40 drop through the aperture 132 in plate 56, FIG. 4, to a receptacle (not shown).

The cam followers 147, 148 may lie on a line that is perpendicular to the line 126', FIG. 5. This may place the cam follower 148, FIG. 5, closer to the anvil member 110 than shown to provide an even more compact arrangement. By way of further example, the cam follower 147, FIG. 3, may be positioned adjacent drive head 146 on line 126' and the cam follower 148 placed on a line with cam follower 147 perpendicular to line 126'. In this case, the corresponding slots for the cam followers 147, 148 are aligned along a line oriented 90° from line 154. The described structure can process very closely-spaced leads of a component. The member 110 and the lead processing heads 70, 72 can be made relatively small and the entire assembly can occupy a very small area on the plate 12 so that multiple closely-spaced components can be concurrently processed. Further, the block 168 may include additional camming slots (not shown) for operating levers of adjacent lead processing assemblies.

What is claimed is:

1. A component lead processing apparatus comprising:

support means for supporting and aligning a printed circuit board relative thereto;

lead processing means coupled to and aligned relative to the support means for processing a pair of leads of a component borne by the aligned printed circuit board;

said lead processing means comprising:

a stationary first member secured to the support means, and second and third rotatable members, the second member rotatable relative to the first member about a first axis, the third member rotatable relative to the first member about a second axis parallel to and spaced from the first axis, said first member having an aperture for receiving said pair of leads to be processed in a direction parallel to said axes;

said second and third members each including lead processing means adapted to cooperate with said first member for processing respective different ones of said pair of leads in response to the rotation of said second and third members; and drive means coupled to said support means for concurrently rotating said second and third members about their respective first and second axes.

2. The apparatus of claim 1 wherein said second and third members of said lead processing means each include first and second lead cutting and bending means abutting a surface of said first member, said lead cutting and bending means each having an outer edge, said outer edges moving closely spaced in opposite tangential directions during said concurrent rotation of said second and third members.

3. The apparatus of claim 1 wherein said drive means includes:

first and second levers attached to different respective ones of said second and third members;

cam follower means attached to an extended end of each said lever, and camming means engaged with said cam follower means adapted to move in first and second opposite linear directions;

said levers, processing means, and camming means being adapted so that said second and third members rotate in the same relative angular direction in response to the movement of said camming means in a given linear direction.

4. The apparatus of claim 3 wherein said drive means includes a link member movable in said linear first and second directions, said camming means including cam means secured to the link member, said cam means having at least one camming slot, said cam follower means being engaged with said one slot.

5. The apparatus of claim 4 wherein said levers are curved, each lever having a bend between its cam follower and the corresponding lead processing means, each lever having one end nested in the other lever at that other lever bend.

6. The apparatus of claim 3 wherein said levers each have a drive end at the corresponding second and third members and a driven end, said drive ends rotatable about said first and second axes, said axes lying in a first line, said driven end including cam follower means lying on a second line and adapted to be moved in said linear direction normal to said first line.

7. A component lead processing apparatus comprising:

support means for supporting and aligning a printed circuit board relative thereto; and lead processing means coupled and aligned relative to the support means for processing a plurality of component leads borne by an aligned printed circuit board;

said lead processing means comprising:

a stationary member secured to the support means, said member having a pair of spaced bearing apertures having parallel bearing axes and a lead receiving aperture between the bearing apertures, first and second lead processing elements, the first element in one bearing aperture, the second element in the other bearing aperture, said lead processing elements each including a lead processing head cooperating with said stationary member to process a corresponding lead inserted in said lead receiving aperture, each said lead processing head rotating about its axis corresponding to its bearing aperture, said heads being tangentially closely spaced in at least one angular orientation relative to their respective axes, and drive means coupled to the support means for concurrently rotating said first and second lead processing heads in opposite tangential directions, first in one sense and then in a second opposite sense.

8. The apparatus of claim 7 wherein said stationary member has a first plane surface, said heads including disc-like lead processing members, each disc-like member having a second plane surface abutting the first surface; and said drive means including first and second nested levers, one lever for rotating one element, the other lever for rotating the other element, and cam means secured to said support means for camming each said levers concurrently in the same linear direction to rotate said elements in said opposite tangential direction in said one and opposite sense.

9. The apparatus of claim 8 wherein said levers are each approximately C shaped, one end of the C being attached to a different element, the other end of the C including cam follower means, said cam means including cam drive means movably secured to said support means for displacing said cam follower means in said same linear direction.

10. The apparatus of claim 9 wherein said cam follower means are aligned in a direction normal to said linear direction, said cam drive means including a cam drive member having at least one slot extending in said normal direction.

11. The apparatus of claim 7 wherein said drive means includes first and second curved levers, the first lever being coupled to one head, the second lever being coupled to the other head, the axis of rotation of one head being partially surrounded by the first lever coupled to the other head, the first lever extended end terminating at a location nested within the bend of the second lever, the extended ends of said levers lying on a first line, said axes of rotation lying on a second line parallel to said first line.

* * * * *